(12) United States Patent
Kamins

(10) Patent No.: US 6,815,750 B1
(45) Date of Patent: Nov. 9, 2004

(54) FIELD EFFECT TRANSISTOR WITH CHANNEL EXTENDING THROUGH LAYERS ON A SUBSTRATE

(75) Inventor: Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 10/155,416

(22) Filed: May 22, 2002

(51) Int. Cl.$^7$ .............................................. H01L 31/119
(52) U.S. Cl. ...................... 257/302; 257/412; 257/382; 257/383; 257/334
(58) Field of Search ................................ 257/302, 412, 257/382, 383, 334; 438/230, 251; 428/357, 364

(56) References Cited

U.S. PATENT DOCUMENTS 5,466,961 A * 11/1995 Kikuchi et al. ............. 257/379
5,471,075 A * 11/1995 Shekar et al. ............... 257/139

OTHER PUBLICATIONS

Stanley Wolf, "Silicon Processing for the VLSI Era, vol. 2—Process Integration," Lattice Press, Sunset Beach, CA (1990), pp. 273–275.*

William C. O'Mara, Robert B. Herring, and Lee P. Hunt, "Handbook of Semiconductor Silicon Technology," Noyes Publ., Norwich, New York (1990), pp. 395, 686.*

Syd R. Wilson, Clarence J. Tracy, and John L. Freeman, Jr., "Handbook of Muiltilevel Metallization for Integrated Circuits," Noyes Publ., Westwood, New Jersey, (1993), pp. 42–44.*

Farrokh Ayazi, and Khalil Najafi, "High Aspect–Ratio Combined Poly and Single–Crystal Silicon (HARPSS) MEMS Technology," J. Microelectromechanical Systems, vol. 9, No. 9 (Sep., 2000) pp. 288–294.*

* cited by examiner

*Primary Examiner*—Eddie Lee
*Assistant Examiner*—Thomas Magee

(57) ABSTRACT

A field effect transistor (FET) has a channel formed in a pore extending up from a conductive portion of a substrate through a stack of planar layers including a first insulating layer, a gate layer, and a second insulating layer. The pore can be upright or inclined relative to the layers. A nanoparticle used for a mask of a directional etching process ultimately defines the size of the pore and therefore the channel width. The substrate or a doped region of the substrate formed immediately beneath the channel can be a source/drain of the FET with the other drain/source being a doped region adjacent the top of the channel. The gate layer can form the gate or can contact a separate gate inside the pore.

17 Claims, 4 Drawing Sheets

FIELD EFFECT TRANSISTOR WITH CHANNEL EXTENDING THROUGH LAYERS ON A SUBSTRATE

BACKGROUND

1. Field of the Invention

The present invention relates to field effect transistors (FETs). More particularly, this invention pertains to a field effect transistor having an elongated conductive channel that is inclined with respect to the upper surface of an etched substrate.

2. Description of the Prior Art

Many proposals have been made for making field effect transistors in silicon nanowires. Elongated nanowires of silicon are characterized by diameters on the order of 5 to 30 nanometers, substantially smaller than conventional integrated circuits that include devices having corresponding dimensions on the order of 100 nanometers or more.

Efficient modulation of the conductance of the channel region of a nanowire FET requires that the channel region of the nanowire be only moderately doped while the regions external to the active channel (source and drain) should be heavily doped to reduce series resistance. (Generally, a "heavily doped" region is understood by those skilled in the art to be characterized by a sufficient amount of doping to produce a resistivity value of 0.01 ohm-cm or less (conductivity of 100 $(ohm\text{-}cm)^{-1}$ or more.)

Unfortunately, it has been found to be relatively difficult to control absolute dimensions and tolerances at the level of 100 nm or less by conventional lithography processes. In many proposed devices, for example, the distances between the heavily doped regions of the nanowire (if heavily doped regions are employed) and the channel are not well controlled. This leads to high and variable series resistance and/or to regions of abnormally high electric field.

SUMMARY OF THE INVENTION

The preceding and other shortcomings of the prior art are addressed by the present invention that provides, in a first aspect, a field effect transistor. Such transistor includes a substrate having a substantially-planar upper substrate surface. An elongated channel of semiconductor material is inclined with respect to the upper substrate surface. The channel includes a top and a bottom with the bottom of the channel contacting the upper substrate surface.

The substrate is substantially conductive in the region contacting the bottom of the elongated channel. The channel includes a heavily doped region adjacent the top thereof. A gate comprises a planar layer of conductive material arranged substantially parallel to the upper substrate surface.

In a second aspect, the invention provides a method for forming a field effect transistor. Such method is begun by providing a conductive substrate. The substrate is then etched to form an upstanding pillar adjacent a substantially-planar upper surface of the etched substrate.

A stack is then formed adjacent the pillar. The stack is of substantially-planar layers of material that include a first insulator layer adjacent the upper surface of the etched substrate, a gate layer of conductive material overlying the first insulator layer and a second insulator layer overlying the gate layer.

The pillar is then etched to the level of the substantially-planar upper surface of the etched substrate to form an upstanding pore within the stack. A gate insulator layer is then formed at the interior of the upstanding pore.

An upstanding channel of semiconductor material is then formed interior of the gate insulator layer having a top region and a bottom region. Finally, the top region of the upstanding channel is heavily doped.

In a third aspect, the invention provides a method for forming a field effect transistor that is begun by providing a substrate of semiconductor material. Such substrate is then etched to form an upstanding pillar adjacent a substantially-planar upper surface of the etched substrate.

A conductively-doped region is then formed within the etched substrate substantially and immediately beneath the pillar. A stack is then formed adjacent the pillar of substantially-planar layers of material comprising a first insulator layer adjacent the upper surface of the etched substrate, a gate layer of conductive material overlying the first insulator layer and a second insulator layer overlying the gate layer.

The pillar is then etched to the level of the substantially-planar upper surface of the etched substrate to form an upstanding pore within the stack. A gate insulator layer is then formed interior to the upstanding pore. An upstanding channel of semiconductor material having a top region and a bottom region is then formed interior of the gate insulator layer. Finally, the top region is then heavily doped.

In a fourth aspect, the invention provides a method for forming a field effect transistor. The method is begun by providing a substrate having an upper surface. A stack of substantially-planar layers of material is then formed on the substrate. Such stack comprises a first insulator layer adjacent the upper surface of the substrate, a gate layer of conductive material overlying the first insulator layer and a second insulator layer overlying the gate layer.

An overlayer is then formed on top of the second insulator layer. The overlayer is then masked with a nanoparticle, then directionally etched to form an upstanding nanopillar on top of the second insulator layer.

A second overlayer is then deposited on top of the second insulator layer and the upstanding nanopillar. The second overlayer is then removed to the top of the upstanding nanopillar and the nanopillar is then removed to leave an upper nanopore within the second overlayer defining an etch mask.

A lower nanopore is directionally etched through the stack of materials to the upper surface of the substrate. The second overlayer is then removed and a gate insulator layer is then formed at the interior of the upstanding lower nanopore. An upstanding channel of semiconductor material is then formed interior of the gate insulator layer having a top region and a bottom region. Finally, the top region of the upstanding channel is heavily doped.

The preceding and other features and advantages of the present invention will become apparent from the detailed description that follows. Such description is accompanied by a set of drawing figures. Numerals of the drawing figures, corresponding to those of the written text, point to the features of the invention with like numerals referring to line features throughout both the written text and the drawing figures.

DETAILED DESCRIPTION OF THE PREFERRED EMBODIMENT

The present invention provides a field effect transistor in silicon nanowires in which the distance between the heavily doped regions and the moderately-doped active channel region of the device is well-controlled to thereby overcome problems associated with devices formed by conventional photolithography. This is obtained by a device configuration in which the distance between the highly-doped source and drain regions and a gate electrode is carefully controlled by controlling the thicknesses of deposited layers of material rather than through reliance upon the processes of photolithography to define such regions.

Figure 1A:
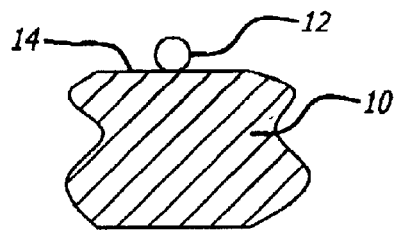
FIGS. 1(*a*) through 1(*n*) are cross-sectional views illustrating resultant structures produced during a process for forming a field effect transistor in accordance with an embodiment of the invention, it being understood that the views illustrated in FIGS. 1(*j*) through 1(*n*) are somewhat enlarged with respect to those of FIGS. 1(a) through 1(i) for clarity of illustration.
Figure 1B:
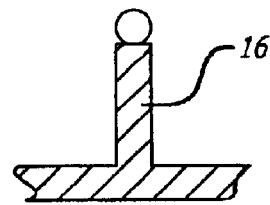
Figure 1C:
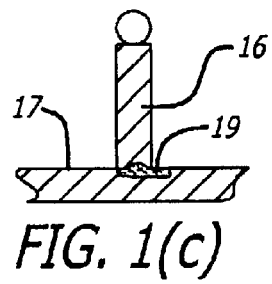
Figure 1D:
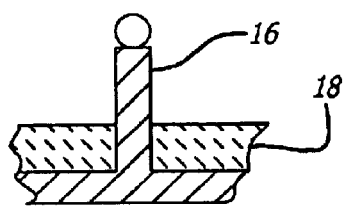
Figure 1E:
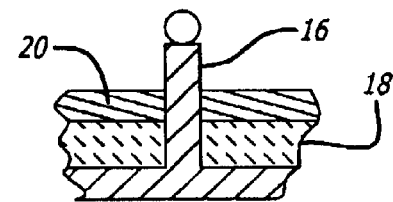
Figure 1F:
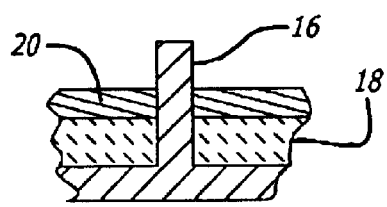
Figure 1G:
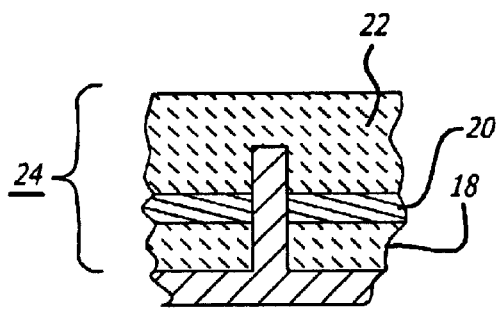
Figure 1H:
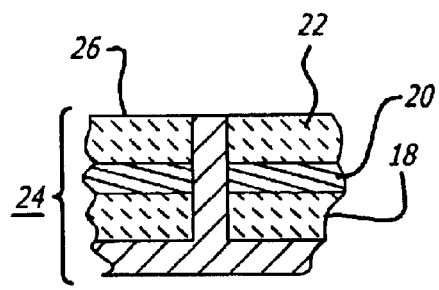
Figure 1I:
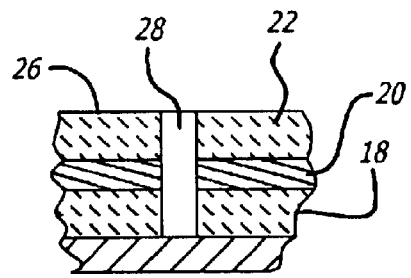
Figure 1J:
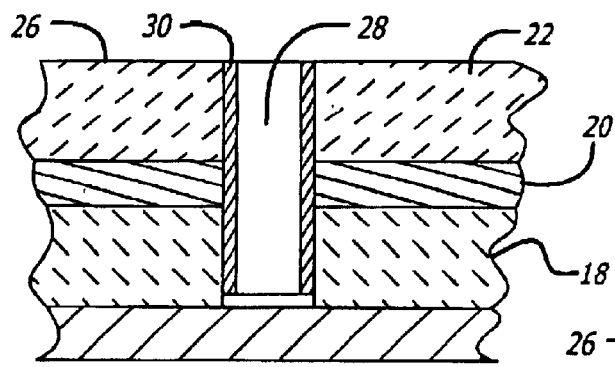
Figure 1K:
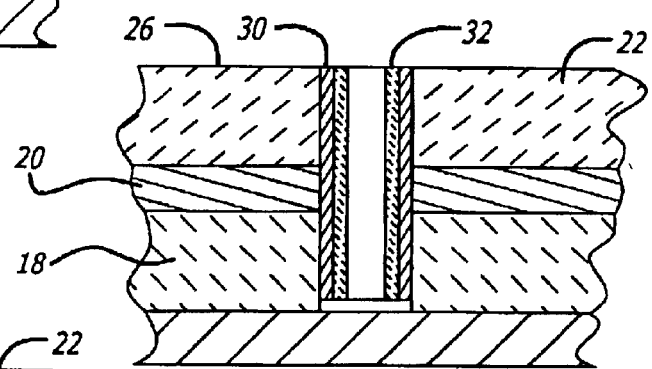
Figure 1L:
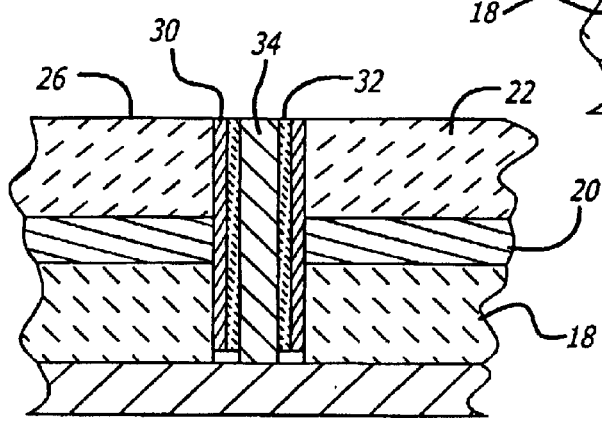
Figure 1M:
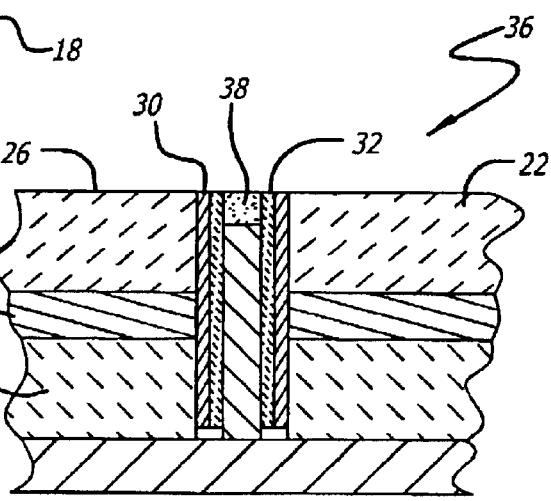
Figure 1N:
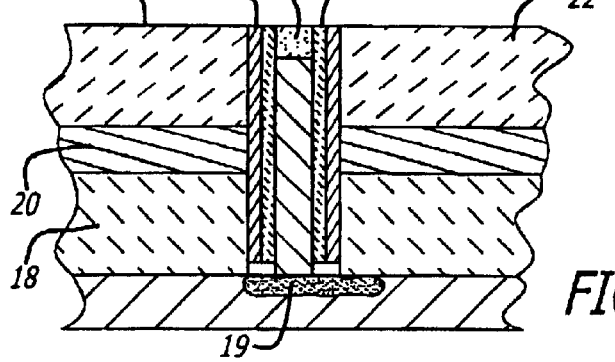

FIGS. 1(a) through 1(n) are a series of cross-sectional views that illustrate resultant structures formed during a process for making a FET in accordance with an embodiment of the invention. The process is begun by providing a substrate 10. The substrate 10 may be of either a (globally or locally) highly-doped single crystal semiconductor or a single crystal conductor, such as a metal that is capable of supporting epitaxial growth of a channel of semiconductor material. Single crystal silicon is an example of a suitable material.

A nanoparticle 12 is applied to the upper surface 14 of the substrate 10 to serve as an etch mask in subsequent processing steps. The nanoparticle 10 can be the result of a dispersion on the surface 14 from the liquid phase or formed by depositing a material of one lattice constant onto a substrate of a different lattice constant and using the forces from the lattice mismatch to form a nanoparticle island.

Nanoparticles of well controlled dimensions are readily available. One source, Ted Pella, Inc. of Redding, Calif., provides gold nanoparticles in a sol with gold particles available in specific sizes ranging from about 2 nm to 250 nm. Such nanoparticles are usually composed of an inorganic crystalline core, typically a metal, that is coated with an organic species to keep the nanoparticles from agglomerating. While the formation of a single FET is illustrated, requiring the formation of a single nanopore and, hence, employing only a single nanoparticle as etch mask, it will be appreciated by those skilled in the art that the following discussion is equally applicable to the formation of a plurality of transistors on a single substrate requiring the distribution of a corresponding plurality of nanoparticles. In such case, the nanoparticles are distributed to a coverage of less than a single layer so that they are separated from one another by a space with no multiple layers of nanoparticles.

The nanoparticle 12 acts as an etch mask for the formation of an underlying nanopillar (discussed below) and such nanopillar is eventually etched away to form a nanopore (also discussed below) for accepting various transistor structures. The size of the nanoparticle 12 (generally in a range of 5 nm to 100 nm) is critical to successful fabrication of the device. By employing a nanoparticle as etch mask, it will be seen to be possible to form a device having a nanowire-sized channel without incurring the substantial expense associated with photolithography.

Returning to the illustrated process for forming a transistor, the structure of FIG. 1(b) results from the directional etching of the substrate 10 with the nanoparticle 12 serving as an etch mask. The etch process may comprise reactive ion etching (RIE) to a controlled depth. The etch chemistry and nanoparticle 12 are selected so that the substrate 10 material is etched much more rapidly than the nanoparticle 12. Such etch process results in the creation of an upstanding pillar 16 of the material of the substrate 10 beneath the nanoparticle 12. (Alternatively, a plurality of pillars would result from the distribution of a plurality of nanoparticles onto a surface 14.) While, for most applications, an elongated nanopillar 16 is envisioned whose axis of symmetry is perpendicular to a substantially-planar upper substrate surface 17, other angular orientations are possible and may be accomplished by tilting the substrate 10 prior to directional RIE etching.

As mentioned above, the substrate 10 may comprise a single crystal semiconductor material. The bulk semiconductor may be either moderately or heavily doped. The choice of a conductor or globally heavily doped semiconductor, as opposed to a moderately doped semiconductor will depend upon a number of factors pertaining, in particular, to whether the substrate 10 is to form a common contact (source or drain) region for a plurality of channels of FETs that are to act in parallel (in concert). In such case, the substrate 10 should be either a conductor or a heavily-doped semiconductor material, thereby forming a common source or drain contact (Note: whether a contact of a FET serves as source or drain depends upon the (external) biasing of the device and is therefore not relevant to the structure or fabrication of a device in accordance with an embodiment of the invention as discussed below.)

In the event that a plurality of FETs, formed on a common substrate 10, are to operated independently of one another, the bulk material of the substrate 10 is not heavily doped. Rather, discrete regions of heavy doping are provided beneath inclined FET channels to form independently-acting transistors on a single substrate 10.

FIG. 1(c) illustrates the structure resulting from the formation of a heavily-doped source or drain region 19 within the substrate 10 at the foot of the nanopillar 16 in a device being fabricated to operate independently of at least one other FET being formed in parallel on the common substrate 10. The heavily-doped region 19 is formed through conventional photolithography steps including, for example, masking and ion implantation followed by an anneal step to activate the dopant, causing doped regions to the sides of the upstanding nanopillar 16 (masked by the presence of the nanopillar 16 during ion implantation) to migrate and thereby form the continuous highly-doped region 19 that extends under the nanopillar 16. It may be noted that the highly-doped region 19 unavoidably extends somewhat into the bottom portion of the nanopillar 16 and is not bounded by the upper surface 17 of the etched substrate 10. This creates no particular problem in a device formed in accordance with an embodiment of the invention as the nanopillar 16 is later removed during processing. This leaves a highly-doped region 19 having a well-defined upper boundary that coincides with the upper surface 17 of the substrate 10. This is to be contrasted with devices in accordance with the prior art, such as a pillar transistor having a substrate and upstanding pillar, formed therewith, that serves as the channel of the device. Such a structure always requires the formation of a highly-doped region that includes an upper portion extending into the pillar whose extent cannot be well controlled. Unlike the case of the present invention, the portion that extends into the upstanding pillar of such a device is not removed during subsequent processing. Consequently, certain problems of the prior art that result from unreliable spacing of source, drain and gate are encountered in such prior art devices.

As the presence or absence of the highly-doped region 19 is not relevant to the following steps, the discussion of the process for fabricating a FET in nanowires will proceed as if the region 19 did not exist and is not illustrated in the subsequent process steps. For this reason, subsequent steps may be assumed to be illustrating a FET formed on a globally conductive or highly-doped substrate 10 in accordance with an embodiment of the invention, taking into consideration that the subsequent processing steps proceed identically from either of the structures illustrated in FIGS. 1(b) (no locally defined highly-doped region) and 1(c).

Proceeding to the subsequent processing steps, the structure of FIG. 1(d) includes a first insulator layer 18, such as silicon oxide or silicon nitride, that has been deposited to a controlled depth by vapor deposition. This comprises the first step in forming a stack of materials that acts to position a gate layer with great accuracy and to thereby locate the active channel of the device with precision overcoming the effect of inaccuracies in defining the source and drain of the device at opposed regions of the elongated planar (or surface) channel of the FET in prior art devices.

A gate layer 20, forming the second element of the above-mentioned stack, is then deposited over the first insulator layer 18 as shown in FIG. 1(e). The layer 20 may comprise either a conductor or a heavily-doped semiconductor material of sufficient thickness to keep the resistance of the transistor control circuity low. A thickness on the order or range of 10 to 200 nm is appropriate for this purpose.

The gate layer 20 is preferably formed by either a physical or chemical (e.g. using silane, $SiH_4$, as source gas) vapor deposition process. Polycrystalline silicon or a high temperature compatibile metal, such as tungsten, is an appropriate material for forming the gate layer 20.

After the gate layer 20 has been formed, the nanoparticle 12, which has acted as an etch mask in prior steps, is shown in the figure to be removed by chemical selective etching and a second insulator layer 22 is deposited to complete the stack 24. (Alternatively, the nanoparticle 12 might be removed during a preceding or subsequent process step. Optimal sequencing of the step of nanoparticle removal will depend upon a number of factors known to those skilled in the art.) Such stack 24 arrangement is illustrated in FIG. 1(g). A suitable second insulator layer 22 may comprise silicon dioxide or silicon nitride that is preferably vapor deposited.

To expose the top of the nanopillar 16, the upper portion of the second insulating layer 22 is reduced in thickness by, for example, chemical-mechanical polishing (CMP), a technique commonly employed in integrated circuit fabrication. At the end of this process, the upper surface 26 of the second insulating layer 22 is flat and composed of both the exposed top of the nanopillar 16 and the surrounding material of the second insulating layer 22. FIG. 1(h) shows the resulting structure after polishing.

A nanopore 28 is formed in the place of the nanopillar 16 as shown in FIG. 1(i). The nanopillar 16 is removed, preferably by gas-phase etching, leaving the nanopore 28 although other processes might be less-advantageously utilized. Gas phase etching is employed in recognition of the extremely small size of the nanopore 28. While a selective gas phase chemical or plasma etch can remove the nanopillar 16 material without significantly attacking the surrounding materials, one may desire to proceed with the process in stages, possibly employing a different etching gas as the material of the nanopillar 16 is sequentially removed from adjacent regions of differing physical properties of the stack 24.

The preceding steps closely parallel the process disclosed in commonly-asigned pending U.S. patent application Ser. No. 10/029,583 of Theodore I. Kamins et al. titled "Method of Forming One or More Nanopores For Aligning Molecules for Molecular Electronics". It differs from the process taught by that application insofar as a stack 24, comprising the first insulator layer 18, the gate layer 20 and the second insulator layer 22, is formed prior to etching the nanopillar 16 to form the nanopore 28. The addition of the conductive gate layer 20 to form the stack 24 will be seen to result in a device in which the location of the active channel of the transistor is clearly defined in relation to source and drain regions. Additionally, by providing a gate layer, electrical contact to the resultant device may be made remote from the channel. As such, problems of high and variable series resistance and regions with abnormally high electric field that result from poor control of the distance between heavily doped regions and the relatively-lightly doped channel are overcome in a device in accordance with an embodiment of the present invention.

FIG. 1(j) illustrates the structure resulting from formation of a conductor layer 30 that lines the interior of the nanopore 28 and forms the gate electrode of the resulting device. The conductor layer 30 contacts the conductive gate layer 20 to extensive with the length of a silicon channel (discussed below) to be formed within the nanopore 28.

The conductor layer 30 is preferably metallic comprising, for example, tungsten or titanium silicide, although highly-doped polysilicon might also be employed, and is formed by deposition (a thermally-activated vapor deposition process is preferred). The thickness of the conductor layer 30 is related to the width of the nanopore 28 to assure that adequate space remains for a FET channel. For example, assuming a nanopore 28 width of 25 nm, the thickness of the conductive layer 30 would be approximately 5 nm. The thickness of the conductive layer 30 is a function of the conductivity of the material of the conductive layer 30. In the case of a very thin conductive layer 30 of high conductivity material, it is preferably formed by vapor deposition.

Material of the conductive layer 30 is prevented from depositing on the bottom of the nanopore 28 or subsequently removed by, for example, highly anisotropic etching. This will be seen to prevent the shorting of the gate of the resultant device.

A gate insulator layer 32 is next formed, as illustrated in FIG. 1(k), atop the conductive layer 30. The gate insulator layer 32 may comprise, for example, $SiO_2$ of 1.5 nm or greater thickness although other dielectrics may be employed. Assuming that $SiO_2$ forms the gate insulator layer 32, a vapor deposition process is appropriate, preferably chemical rather than physical. As in the case of the conductive layer 30, the gate insulator layer 32 is prevented from forming on the bottom of the nanopore 28 or removed by highly anisotropic etching.

A channel 34 is then formed within the nanopore 28 as shown in FIG. 1(l). The channel 34 may be fabricated of either single crystal or polycrystalline silicon although the size (width) of the void remaining within the nanopore 28 may favor the formation of material without grain boundaries. A chemical vapor deposition process is preferred for forming the channel 34 preferably of single crystal silicon or (if possible) polycrystalline silicon.

Despite the above-mentioned caution, one may generally expect the channel 34 to be formed of the same material as the underlying single crystal substrate 10. (Other possibilities for the channel 34 include one of a single crystal semiconductor material differing from the single crystal semiconductor material of the substrate 10 or one of semiconductor material formed on a conductive substrate 10.) Molecular beam epitaxy may alternately be employed to form the channel 34 generally resulting in the same crystalline structure for the channel 34 as that of the substrate 10.

The completed FET 36 is illustrated in FIG. 1(m). A source or drain region 38 is formed at the top of the channel 34 by heavily doping that region with an appropriate dopant such as boron (p-type), phosphorus (n-type) or arsenic (n-type). Well-known processes, such as ion implantation or gas phase doping processes may be employed. It is generally recognized that the latter type of process generally yields a higher concentration of dopant.

A FET 39 in accordance with the invention is illustrated in FIG. 1(n). The device of FIG. 1(n) represents the product of the process that comprises steps 1(d) through 1(m) with the highly doped region 19 included. As can be seen, the FET 39 is identical to the FET 36 of FIG. 1(m) with the exception of the presence of the highly doped region 19 within a moderately doped semiconductor substrate 10. The differing configuration enables the FET 39 to operate independently of any other FETs that may have also been formed on a common substrate.

Figure 2A:
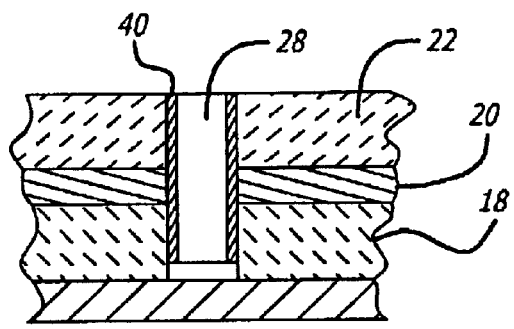
FIGS. 2(a) through 2(c) are cross-sectional views illustrating the resultant structures produced during a portion of a process for forming a field effect transistor in accordance with an alternative embodiment of the invention.
Figure 2B:
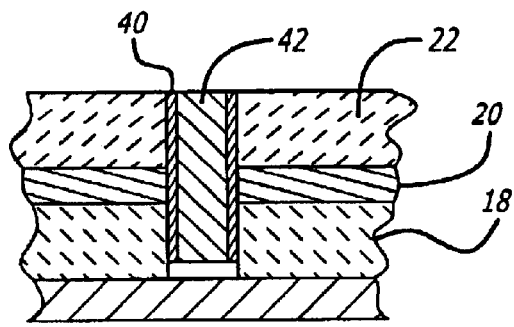
Figure 2C:
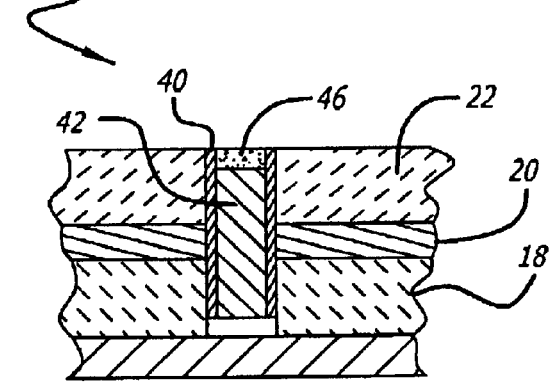

FIGS. 2(a) through 2(c) are a series of cross-sectional views for illustrating a portion of a process for forming a field effect transistor in accordance with an alternative embodiment of the invention. The illustrated steps proceed from those illustrated in, and discussed with reference to, FIGS. 1(a) through 1(i) above.

In FIG. 2(a), a gate insulator layer 40 is applied to the interior wall of the nanopore 28. In contrast to the prior process, a conductive layer was not previously deposited onto the inner wall of the nanopore 28 as illustrated in FIG. 1(j). The absence of a conductive layer results in the gate layer 20 defining the gate electrode of the resultant FET rather than acting solely as a contact to the gate electrode. In the event that the gate layer 20 is of heavily doped polysilicon, the gate insulator layer 40 may be thermally grown. Otherwise, the gate insulator layer 40 is formed by a vapor deposition process.

In FIG. 2(b), either single crystal silicon or polysilicon is deposited within the nanopore 26 to form a channel 42. The processes and considerations discussed with reference to the process step previously illustrated in conjunction with FIG. 1(l) are applicable to the formation of the channel 42 of the alternative embodiment of a transistor in accordance with the invention.

The transistor 44 is completed as illustrated in FIG. 2(c) by the creation of a heavily-doped region 46 that serves as a source or drain of the transistor. The resultant transistor 44 in accordance with the alternative embodiment of the invention differs from the transistor 36 of the prior embodiment by the absence of a conductive layer 30 and, as mentioned earlier, results in a device in which the gate layer 20 itself serves as the gate electrode. Such a transistor structure possesses certain advantages over the device of the prior embodiment including simpler processing, shorter gate and channel lengths and reduced overlap (source-to-gate, drain-to-gate) capacitance.

Alternative process steps for use in forming a transistor in accordance with an embodiment of the invention are illustrated in FIGS. 3(a) through 3(h). Such alternative steps address the possible difficulty of achieving a uniform multilayer stack 24 adjacent the nanopillar 16.

Figure 3A:
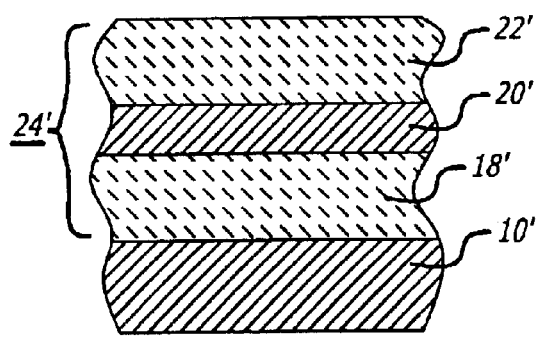
FIGS. 3(a) through 3(h) are cross-sectional views of the resultant structures produced during a sequence of process steps for forming a nanopore for use in fabricating a field effect transistor in accordance with an alternative embodiment of the invention.
Figure 3B:
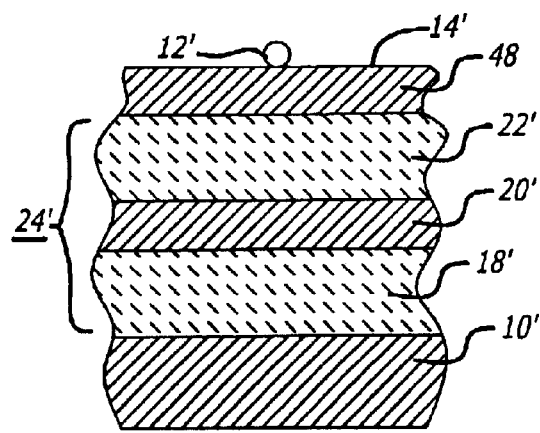

In FIG. 3(a), a first insulator layer 18', a gate layer 20' and a second insulator 22' forming a multilayer stack 24' atop a substrate 10' are applied as described above. Thereafter, as illustrated in FIG. 3(b), an overlayer 48 is applied, preferably by vapor deposition over the multilayer stack 24'. The overlayer 48 may comprise insulator, semiconductor or conductor material, preferably of amorphous character. Polycrystalline material is disfavored for the presence of grain boundaries that may introduce complications during subsequent etching of the overlayer 48.

Figure 3C:
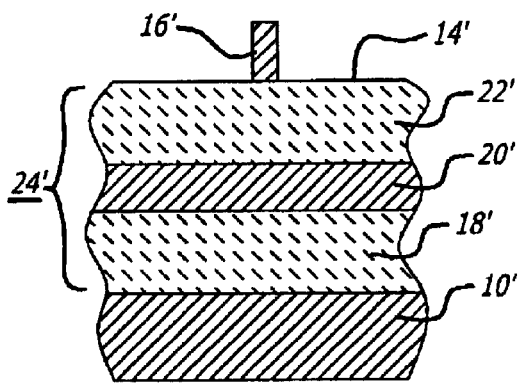
Figure 3D:
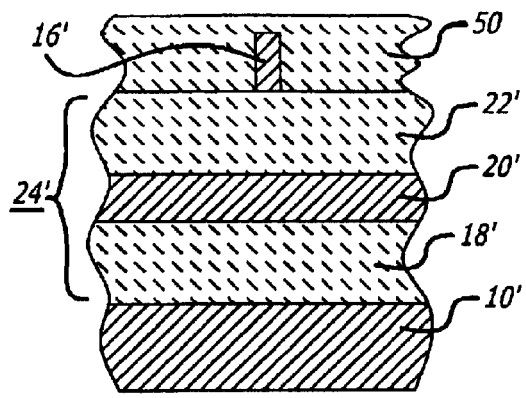
Figure 3E:
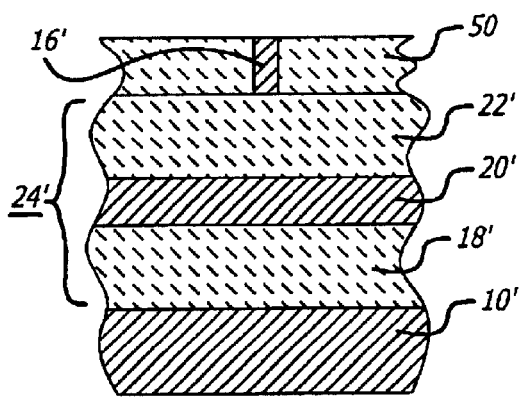

A nanoparticle 12' is applied to the top surface 14' of the overlayer 48 as described with reference to FIG. 1(a); above. The overlayer 48 is then directionally etched to form a nanopillar 16' as shown in FIG. 3(c). A second overlayer 50 is then deposited as shown in FIG. 3(d), covering the top of the nanopillar 16'. In FIG. 3(e), the top of the nanopillar 16' is exposed by the removal of the excess material in accordance with processes discussed in relation to the structure illustrated in FIG. 1(h) above.

Figure 3F:
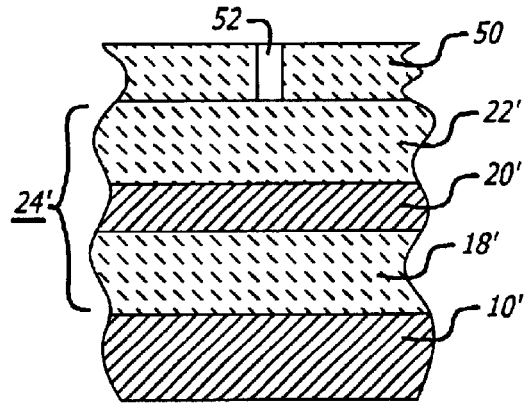
Figure 3G:
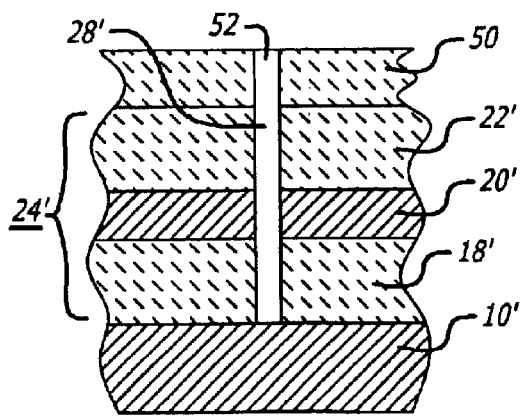
Figure 3H:
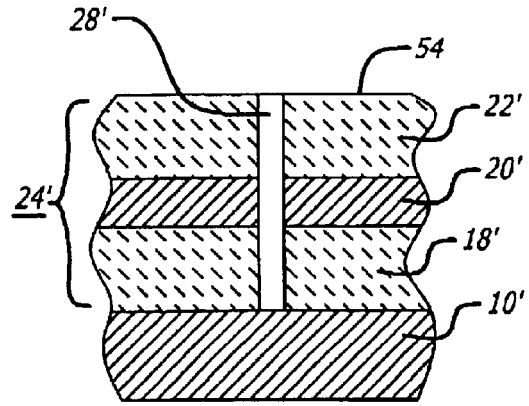

The nanopillar 16' is then selectively etched, leaving an overlayer nanopore 52 as shown in FIG. 3(f). The second overlayer 50, with overlayer nanopore 52, then acts as an etch mask for etching a nanopore 28' through the underlying stack 24' as illustrated in FIG. 3(g). The second overlayer 50 is then etched to the top surface 54 of the stack as in FIG. 3(h), producing a structure identical to that of FIG. 1(i). From this point, one may proceed with the sequence of steps illustrated in FIGS. 1(j) through 1(m) to produce the transistor 36 of FIG. 1(m). Alternatively, one may proceed from this point with the series of steps illustrated with reference to FIGS. 2(a) through 2(c) to produce the transistor 44 in accordance with an alternative embodiment of the invention.

Thus it is seen that the present invention provides a field effect transistor and a method for its manufacture that is both economical and advantageous in the resultant device. By forming a FET in accordance with the teachings of the invention, one may produce a device having an extremely narrow, yet well-defined active channel. As such, problems such as high and variable series resistance and regions of abnormally high electric field are avoided.

By utilizing a nanoparticle etch mask, the costs associated with the high resolution photolithography are avoided. By forming the gate electrode (or gate electrode contact) of a conductive layer of material, within a stack that includes insulator layers, adjacent the vertically-oriented channel of the FET, the spacing of the gate from the source or drain electrode formed at the upper surface of the underlying substrate is well defined.

While this invention has been defined with reference to its presently-preferred embodiment, it is not limited thereto. Rather, the invention is limited only insofar as it is defined by the following set of patent claims and includes within its scope all equivalents thereof.

What is claimed is:

1. A field effect transistor comprising, in combination:
   a) a substrate having a substantially-planar upper substrate surface;

b) an elongated channel of semiconductor material;

c) said channel including a top and a bottom with the bottom of the channel contacting said upper substrate surface;

d) said substrate being substantially conductive in the region contacting said bottom of said elongated channel;

e) said channel including a heavily doped region adjacent the top thereof; and f) a gate comprising a planar layer of conductive material arranged substantially parallel to said upper substrate surface, wherein the planar layer comprises a pore through which the elongated channel extends.

2. A field effect transistor as defined in claim 1 further including a gate insulator layer substantially surrounding the length of said elongated channel.

3. A field effect transistor as defined in claim 1 further including a first substantially-planar insulating layer between said gate and said upper substrate surface.

4. A field effect transistor as defined in claim 3 further including a second substantially-planar insulating layer overlying said gate.

5. A field effect transistor as defined in claim 2 further including a layer of conductive material in contact with said gate and substantially surrounding the length of said elongated channel.

6. A field effect transistor as defined in claim 1 wherein said substrate is of semiconductor material.

7. A field effect transistor as defined in claim 6 wherein said semiconductor material is globally moderately-doped and includes a locally highly-doped region adjacent the bottom of said elongated channel.

8. A field effect transistor as defined in claim 6 wherein said semiconductor material is globally heavily-doped.

9. A field effect transistor as defined in claim 1 wherein said elongated channel comprises silicon.

10. A field effect transistor as defined in claim 1 further characterized in that:

a) said substrate comprises single crystal silicon; and b) said elongated channel comprises silicon epitaxially grown from said substrate.

11. A transistor comprising:

a substrate;

a first insulating layer overlying the substrate;

a substantially-planar conductive layer overlying the first insulating layer;

a second insulating layer overlying the conductive layer, wherein a pore extends through the second insulating layer, the conductive layer, and the first insulating layer to the substrate; and a gate insulator and a channel in the pore, the gate insulator insulating the channel from the substantially-planar conductive layer, wherein:

a first terminal of the transistor resides in the substrate and contacts a bottom of the channel;

a second terminal of the transistor resides at top of the channel; and a gate of the transistor comprises an edge of the substantially-planar conductive layer surrounding the pore.

12. The transistor of claim 11, wherein a length of the gate is equal to a thickness of the substantially-planar conductive layer.

13. The transistor of claim 11, wherein the channel is substantially orthogonal to an upper surface of the substrate.

14. A field effect transistor as defined in claim 1, wherein said pore is a nanopore.

15. A field effect transistor as defined in claim 4, wherein said pore extends through said first substantially-planar insulating layer and said second substantially-planar insulating layer.

16. A field effect transistor as defined in claim 15, further including a gate insulator layer that substantially surrounds said elongated channel and resides between said gate and said elongated channel in said pore.

17. A field effect transistor as defined in claim 16, further including a layer of conductive material that is within said pore, in contact with said gate, and substantially surrounds the length of said elongated channel.

* * * * *